(12) United States Patent
Miller et al.

(10) Patent No.: US 8,856,603 B2
(45) Date of Patent: Oct. 7, 2014

(54) METHOD FOR DETECTING AND CORRECTING ERRORS FOR A MEMORY WHOSE STRUCTURE SHOWS DISSYMMETRICAL BEHAVIOR, CORRESPONDING MEMORY AND ITS USE

(75) Inventors: Florent Miller, Paris (FR); Thierry Carriere, Triel sur Seine (FR); Antonin Bougerol, Suresnes (FR)

(73) Assignees: European Aeronautic Defence And Space Company EADS France, Paris (FR); Astrium SAS, Paris (FR)

( * ) Notice: Subject to any disclaimer, the term of this patent is extended or adjusted under 35 U.S.C. 154(b) by 961 days.

(21) Appl. No.: 12/999,485

(22) PCT Filed: Jun. 18, 2009

(86) PCT No.: PCT/FR2009/051165
§ 371 (c)(1),
(2), (4) Date: Apr. 12, 2011

(87) PCT Pub. No.: WO2009/153527
PCT Pub. Date: Dec. 23, 2009

(65) Prior Publication Data
US 2011/0185245 A1    Jul. 28, 2011

(30) Foreign Application Priority Data
Jun. 19, 2008 (FR) .................................... 08 54055

(51) Int. Cl.
| | |
|---|---|
| G06F 11/00 | (2006.01) |
| G11C 29/52 | (2006.01) |
| G11C 11/412 | (2006.01) |
| G11C 11/41 | (2006.01) |

(52) U.S. Cl.
CPC ................ *G11C 29/52* (2013.01); *G11C 11/41* (2013.01); *G11C 11/4125* (2013.01)
USPC ............... 714/746; 714/52; 714/758; 714/42; 714/759; 714/760; 714/797; 714/811; 714/816; 714/819; 365/189.03; 365/189.04; 365/189.07; 365/201; 365/210.1

(58) Field of Classification Search
None
See application file for complete search history.

(56) References Cited

U.S. PATENT DOCUMENTS

| | | | | |
|---|---|---|---|---|
| 5,048,023 | A * | 9/1991 | Buehler et al. | 714/773 |
| 5,200,963 | A * | 4/1993 | Chau et al. | 714/820 |
| 6,668,341 | B1 * | 12/2003 | Krauch et al. | 714/52 |
| 6,785,169 | B1 * | 8/2004 | Nemati et al. | 365/189.07 |
| 7,362,606 | B2 * | 4/2008 | Chuang et al. | 365/154 |
| 7,495,949 | B2 * | 2/2009 | Buettner et al. | 365/154 |
| 2004/0066690 | A1 * | 4/2004 | Perner et al. | 365/209 |
| 2010/0232214 | A1 * | 9/2010 | Papaix | 365/154 |

OTHER PUBLICATIONS

International Search Report dated Jan. 13, 2010.

* cited by examiner

*Primary Examiner* — John Trimmings
(74) *Attorney, Agent, or Firm* — RatnerPrestia

(57) ABSTRACT

To produce a memory which resists ion or photon attack, a memory structure is chosen whose memory point behaves asymmetrically with regard to these attacks. It is shown that in this case, it is sufficient to have a reference cell for an identical and periodic storage structure in order to be able to correct all the memory cells assailed by an attack. An error correction efficiency of ½ is thus obtained, with a simple redundancy, whereas the conventional methods make provision, for the same result, to triple the storage, to obtain a less beneficial efficiency of ⅓.

10 Claims, 4 Drawing Sheets

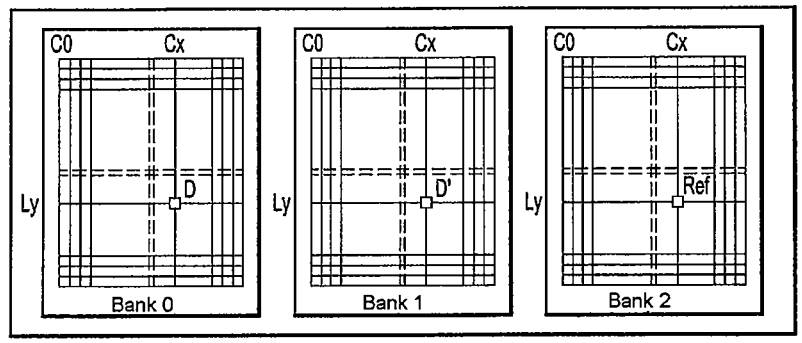
Fig. 6
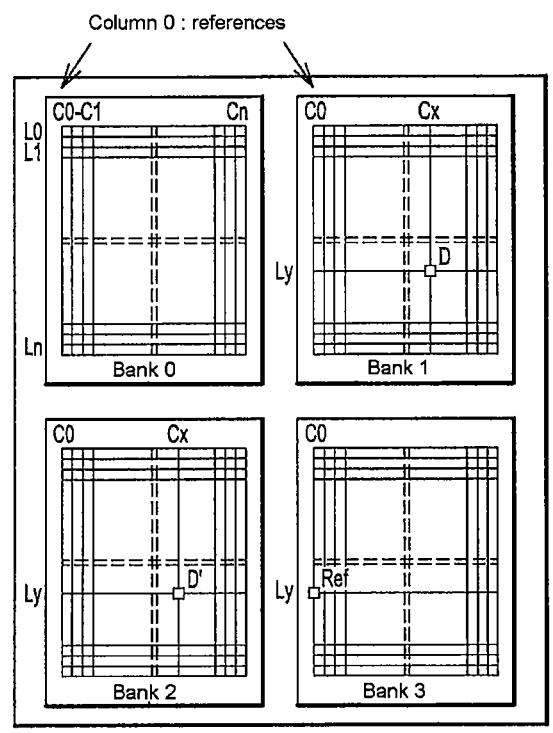
Fig. 7
Fig. 8

METHOD FOR DETECTING AND CORRECTING ERRORS FOR A MEMORY WHOSE STRUCTURE SHOWS DISSYMMETRICAL BEHAVIOR, CORRESPONDING MEMORY AND ITS USE

This application claims priority of PCT International Application No. PCT/FR2009/051165 filed on Jun. 18, 2009, the contents of which are incorporated herein by reference.

FIELD OF THE INVENTION

An object of the present invention is a method for detecting and correcting errors for electronic memories in which the memory cell shows dissymmetrical storage behavior. The method enables the use, in aeronautical or space applications, of commercially available electronic memories that are not specifically protected despite their sensitivity to external energy reactions. It can be applied to all classes of semiconductor-based memories with dissymmetrical behavior, embedded in systems that have to move in environments disturbed by natural or artificial radiation.

BACKGROUND

In the case of a natural radiating environment, one effect against which the invention provides protection is called a singular effect. This is a non-destructive effect which takes the form of a reversal of one or more pieces of logic information stored in an electronic memory. Effects of this kind are prompted by the input of electrical charges following the passage of an ionizing particle, whether directly or indirectly.

There are a certain number of error-detection and error-correction techniques existing at present that are implemented to address this set of problems. However, their efficiency is proportionate to their complexity and cost. This is why any use is often restricted to the most vitally important elements of a system. The unit information element, known as a bit, is a piece of binary information and can take the value "1" or "0". A set of several bits is called a word. The criteria determining the efficiency of an error-detection and error-correction technique are the number of erroneous bits that can be detected in a word, the number of erroneous bits that can be corrected, the processing time and the quantity of resources needed to make these detections and corrections. The rate "R" is the ratio between the number of bits to be corrected and the number of bits to be stored.

In order of complexity, several different detection and correction techniques can be distinguished. The parity codes technique enables the detection of only one error in a word. For a piece of information encoded on N bits, an additional bit is stored. This technique does not enable error correction. The Hamming codes technique can be used to detect two errors and correct one error in a word. The Hamming code (11, 7) for example thus makes it possible to correct a 7-bit piece of information by adding 4 additional bits. This code is the one whose rate, i.e. the number of bits transmitted relative to the number of payload bits, is the maximum in the context of the correction of a single bit in a word.

The Reed-Solomon codes technique corrects several errors within a same word. For an N-bit piece of information and to correct K bits, it is necessary to store N+2K bits. Thus, to correct the totality of the N bits of the word, it is necessary to store 3×N bits. The rate is therefore R=⅓.

The triplication technique uses triple redundancy, i.e. each piece of data is stored in three copies. A voter-type element compares the three pieces of data and selects the value that appears at least twice. As in the previous techniques, to protect the N bits of a word, 3×N bits have to be stored. The rate is therefore also R=⅓.

At present, systems that protect the totality of the bits of a word therefore need to be able to store at least three times more information, giving a rate R=⅓. The proposed invention is a technique for detecting and correcting the totality of the bits of a word, whatever its length, and therefore calls for less storage of additional bits than do existing techniques, the rate being closer to R=½.

SUMMARY OF THE INVENTION

The invention relies on a property intrinsic to certain classes of electronic memories, for which a dissymmetrical, or asymmetrical, behavior is observed in the storage structure and for which one of the two possible states is insensitive to external disturbance.

The term "memory with symmetrical behavior" is used when the information is stored in a symmetrical structure, as is the case for example in an SRAM memory cell implementing two cross-coupled inverters. FIG. 1 in this respect shows a SRAM memory cell with a symmetrical structure.

On the contrary, the term "memory with dissymmetrical behavior" refers to memories in which the logic information is stored in a non-symmetrical structure such as for example a capacitor which stores a quantity of electrical charges, or a transistor which stores a quantity of electrical charges in its floating gate.

The invention can be applied without distinction to volatile and non-volatile type memories. The term "volatile memory" is understood to mean memories that lose the information stored when they are powered off. Conversely, the term "non-volatile memory" refers to a memory that retains information when it is powered off.

Memories that have dissymmetrical behavior and are volatile include, for example, the class of memories known as DRAMs or Dynamic Random Access Memories (VDRAM, RDRAM, XDRDRAM, EDODRAM, DDR, DDR2, DDR3, eDRAM, DRAM, PFEM and other memories), for which the logic information is stored in a capacitive structure. The information stored may be a logic "1" or a logic "0" depending on whether the capacitor is charged or not.

FIG. 2 is a view in section of an example of a structure, as well as an associated schematic representation, of a DRAM memory cell. This memory cell 1 has a capacitor C1 connected by a transistor M1 to a bit row 2. The transistor M1 is controlled by a word row 3 connected to its gate. The potential of the armature of the capacitor connected to the transistor M1 is taken to VCC when the memory cell stores a 1. It is taken to ground potential when it stores a 0. Non-volatile memories with dissymmetrical behavior belong to the class of EPROMS and FLASH memories with a floating-gate transistor as the storage element.

The invention can be applied to the above-mentioned memories, whether they are single-cell or multiple-cell memories. A single-cell memory is a memory storing one piece of binary information per physical structure. A multiple-cell memory is a memory that stores several pieces of binary information in one and the same physical structure.

The term "state", understood as an electrical state, is a physical state of a cell, for example a cell with electrons that may or may not be stored in a concerned armature of a capacitor of a DRAM memory or with electrons stored or not stored in the floating gate of a floating-gate transistor of an EPROM or a FLASH memory.

The term "piece of binary information" or "binary information element", which fundamentally depends on a read protocol, a read mode, is a logic state, as opposed to an electrical state, having a value of 1 or 0. Depending on whether the context is one of positive logic or negative logic, in a same electrical state, electrons stored on a capacitor plate or in a floating gate can correspond to two different logic states.

The physical property used is that of the insensitivity to the collection of parasitic charges of two possible states of a memory cell with dissymmetrical behavior. In other words, it is a specific feature of this type of cell that it has only one state subjected to extreme disturbances. The opposite state is therefore insensitive.

For example, for DRAM memories for which the bit is expressed by the presence or absence of electrical charges, when the cell has its capacitor charged, the addition of additional charges induced by external attack will have no effect because the cell cannot contain more charges than those that it already contains. Even if the cell is not completely charged, the effect will be a reinforcement of its logic state. Its charged state will therefore be the state of insensitivity and its uncharged state will be the sensitive state. Since the charges collected by external attack are electrons for an NMOS transistor, the state of insensitivity is that for which the capacitor gets charged negatively and is therefore the one for which the armature connected to the transistor M1 is charged with electrons. For a PMOS transistor, it is the holes that are collected and the reverse reasoning is therefore applied.

The implementation of the invention also takes account of another property inherent in the construction of peripheral circuits. This property is that in which a logic state is read as being opposite to the physical state for half of the memory cells: those connected to complementary columns.

Thus, two read modes will be referred to. A first mode is a positive logic mode. This first mode, for example for a first part of the cells of the memory, interprets the presence of the electrons as a first given binary state. A second mode on the other hand is a negative logic mode.

This second mode, for example for a second part of the cells of the memory, interprets the presence of the same electrons as a second given binary state that is complementary to the first state.

The consequence of this is the equal probability, for a given cell and for a given state, that it will be read as a logic "1" or a logic "0".

In order to illustrate this aspect, FIG. 3 enables a description of the read cycle of an entire DRAM type cell. By construction, each cell, Cell 1 and Cell 2, is connected to a row (word row) and to a column (bit column). The columns work in pairs.

Initially, the two columns 2 and 2', those attached to the Cell 1 and its complementary cell, Cell 2, are pre-charged to a known voltage level. When the word row 3 of the cell is selected, there is a transfer of charges between Cell 1 and its column 2, giving rise to a variation in the voltage of the column. This variation, (positive or negative) is of the order of about ten millivolts. This voltage is then compared with that of the complementary column and the amplifiers 4 and 5 are activated to increase the difference. The signal then reaches one of the two inputs of a differential amplifier 6, responsible for delivering a logic voltage. If a voltage of its positive input is greater than that of its negative input, then the logic output will be "1". If not, the output will be "0".

Thus, by its design, the differential amplifier routinely inverts the value of its negative input, the one connected to the complementary columns.

The present invention thus recommends the use of a property intrinsic to commercially available electronic memories with dissymmetrical structure, namely the property of insensitivity of one of their two states to external attack. This insensitivity enables the designing of memory architectures that tolerate disturbances prompted by the natural radiation environment.

In general, the invention can be applied to any component with dissymmetrical behavior, for which there is an identical or complementary periodic structure.

The invention implements a method for detecting and correcting errors based on the duplication of data to be protected, each one being recorded in a distinct structure, associated with a reference of the insensitivity pattern of these very same structures.

The illustration of the elementary principle implements three structures formed by single cells, with a duplication and reference of insensitivity pattern.

According to the invention, whatever the embodiment, it is important that an electrical state of a reference should be a state that has not been capable of changing because of the attack. Typically, if these electrons are diffused in a component because of ion or photon attack, they can then be stored anywhere whatsoever. They can therefore also get stored in a reference memory cell. If this cell is in a state in which it already has stored electrons, the fact of having a few more of them will not change its electrical state or its logic state. With a choice of this kind, the reference is insensitive to external attack. Depending on its electrical state as read, the reference also indicates that electrical state which was incapable of changing.

An object of the invention therefore is a memory comprising:
  memory cells, which are single or multiple cells, with dissymmetrical behavior.
  a dissymmetrical behavior resulting from the sensitivity of a memory cell in a first electrical state by which it changes its state into a second electrical state during an attack by irradiation, this sensitivity being lower for passing from the first state into the second state than for passing from the second state to the first state,
  pairs of memory cells formed by these memory cells with dissymmetrical behavior,
  a first cell of a pair being loaded with a first piece of binary information and a second cell of the pair being loaded with a second piece of binary information,
  characterized in that it comprises:
  a detector to detect the fact that the memory cells of a pair are loaded with two pieces of contradictory information instead of two pieces of consistent information, and
  a reference memory cell of a pair loaded with a piece of information corresponding to the first state,
  a logic circuit to designate, as a function of the reference memory cell of the pair, that one of the memory cells of the pair which is in a true state.

An object of the invention is also a method for detecting and correcting data errors stored in a memory, the memory cell of which has dissymmetrical behavior, wherein:
  the pieces of data to be corrected are stored in two data banks,
  an error is detected in one bank and
  it is corrected with the content of the other bank,
  characterized in that:
  a dissymmetrical behavior results from the sensitivity of a memory cell in a first state whereby it changes its state to a second electrical state during an attack by irradiation, this sensitivity being lower for going from the first state to the second state rather than for going from the second state to the first state, pairs of memory cells are formed by means of memory cells with dissymmetrical behavior, a first cell of a pair is loaded with a first piece of binary information and a second cell of the pair being loaded with a second piece of binary information, a piece of information corresponding to the first state is stored in a pair reference memory cell, it is detected that the memory cells of a pair are loaded with two pieces of contradictory information instead of two pieces of consistent information, and a logic circuit is used to designate, as a function of the pair reference memory cell, that cell of the memory cells of the pair that is in a true state.

BRIEF DESCRIPTION OF THE DRAWINGS

The invention will be understood more clearly from the following description and from the accompanying drawings. These drawings are given purely by way of a description and in no way restrict the scope of the invention. Of these drawings:

FIG. 6 shows different possibilities of error, and associated corrections as a function of a reference pattern;

FIG. 7 is an example of a single-package configuration in which a subdivision is a bank;

FIG. 8 shows the same example with a column 0 taken as a reference pattern column

DETAILED DESCRIPTION

Figure 1:
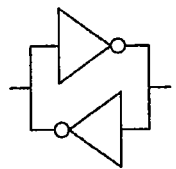
FIG. 1: already commented upon, refers to a SRAM memory cell with a symmetrical structure.
Figure 2:
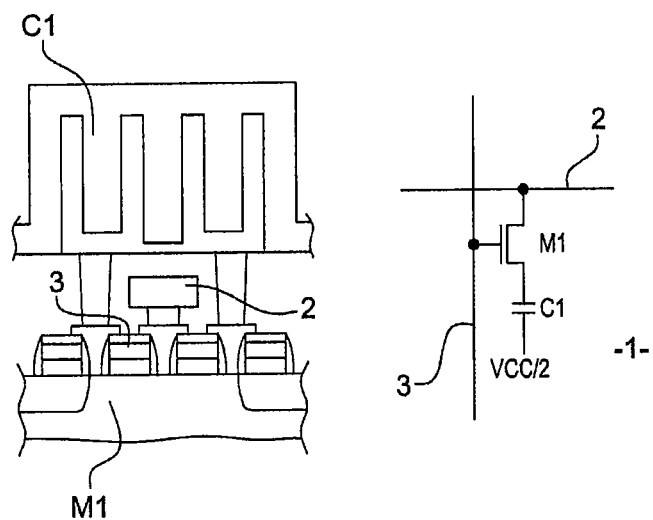
FIG. 2, already commented upon, is a view in section of an example of a dissymmetrical structure as well as the associated schematic representation for a DRAM memory cell.
Figure 3:
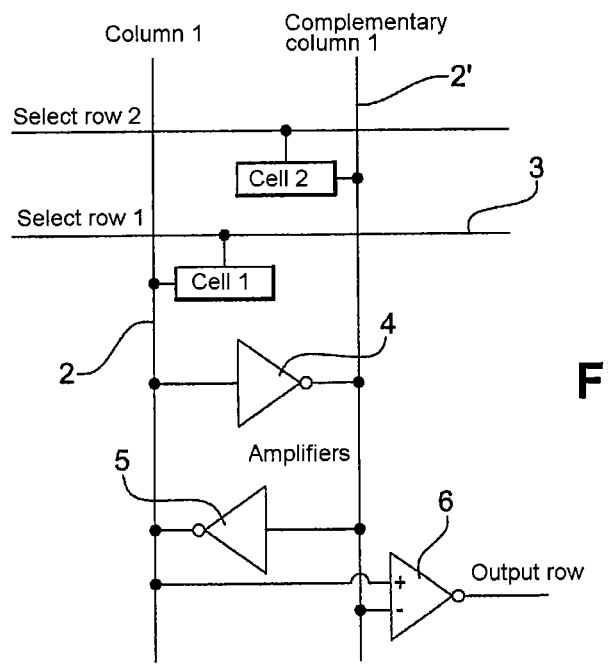
FIG. 3 which has already been commented on depicts a read cycle of an entire DRAM type cell.
Figure 4:
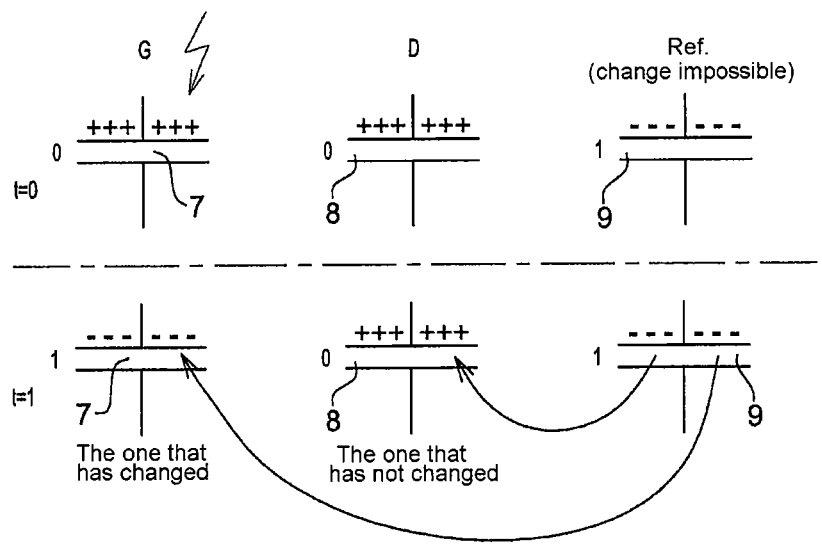
FIGS. 4 and 5 show three identical structures with dissymmetrical behavior showing an elementary principle of the invention with a positive and negative read mode respectively.

Thus, the top part of FIG. 4 gives a schematic view of a cell 7 (a DRAM cell) coupled to a DRAM cell 8. The DRAM memory in question is a memory whose cells adopt a dissymmetrical behavior. This will be the case also for all other categories of DRAM memories as also for EPROM memories and more generally for all memories for which the electronic behavior of the cells is not symmetrical. The cells 7 and 8 are coupled in the sense that they must store one and the same piece of information. The cells 7 and 8 are situated at different places of the memory, for example on a same word row, but in this case, one is in the left-hand half plane G of the memory plane while the other is in a right-hand half plane D of the memory plane of the component. The fact of having two cells to store a same piece of information already shows that the rate of storage is ½ if there is redundancy. The coupling of the two cells can be more complex, for example when their address words can be complementary. In any case, they must store a consistent piece of information.

With the above-mentioned conventions, and for a given read mode, the two cells 7 and 8 store a binary logic state 0 symbolized by + in the armature of the capacitor. This electrical state is a fragile state in that it is liable to change. Indeed, this is what happens after an attack, as shown in dashes in the lower part of FIG. 4 where the electrons have degraded the physical state of the cell 7 of the left-hand half plane, the + electrical state of which has deteriorated into a − electrical state (the reading of which would reveal a logic 1).

The reference cell 9, assigned to this pair of cells 7 and 8, is normally in an electrical state that is insensitive to attacks. The capacitor stores electrons and with the chosen read mode, it indicates a logic 1. The cell 9, even if it is being subjected to attack, can therefore change neither its electrical state nor its logic state.

Figure 5:
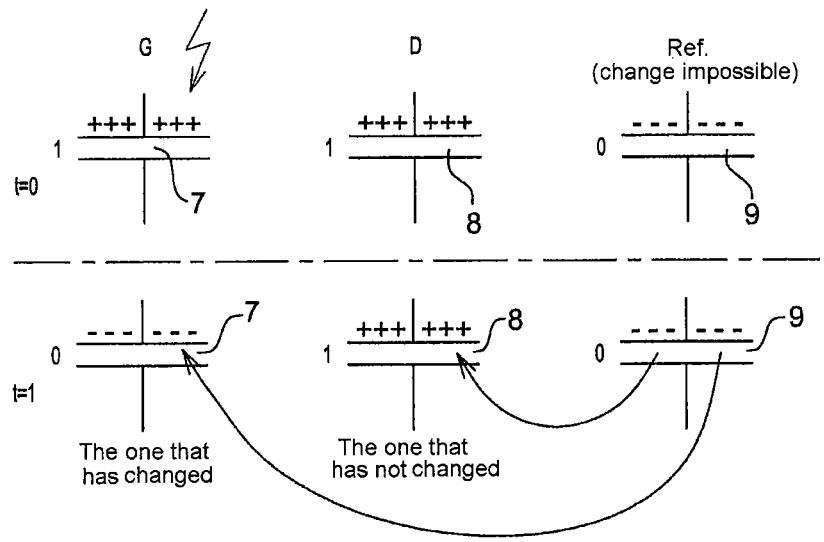

With a detector, before validating the reading of the cell 7 and 8, it is ascertained that they indicate a consistent logic state. The term "consistent" is understood to mean that the two cells, when not subjected to attack, must indicate a same final logic state. Either, as can be seen in FIGS. 4 and 5, the cells of a pair 7 and 8 are both read with a same read mode (positive read mode in FIG. 4, negative read mode in FIG. 5) or they are read with complementary modes. Should they be read with a same mode, as seen in FIGS. 4 and 5, the cells of a pair are in a same electrical state to designate a same logic state. Should they be read with complementary modes, the cells of a pair are in complementary electrical states to designate a same logic state.

In the case of FIG. 4 and FIG. 5, a consistent state revealing consistent information is therefore the one in which the two cells 7 and 8 are in a same electrical state, therefore with the same read mode, in a same logic state, so that together they reveal a same final logic state. If not, they are in a contradictory state. This is what happens at the bottom of FIG. 4 and the bottom of FIG. 5 where a contradictory state is detected by a read validation detector. The read validation detector is the detector seen further below which can be used to know whether the pieces of information read are consistent, whether they are therefore both true, or whether they are contradictory. And in this case only one is true.

In this contradictory state, it is deduced that one of the two pieces of information is erroneous. Given that the reference L9 is in an insensitive state, it can be deduced that only the cell 7 which is in a same electrical state as the cell 9 has changed. Indeed, the cell 9 has not passed from an electrical state with − charges to an electrical state with + charges, since this passage is not possible under the effect of external attack. Hence, the cell 8 is herein the one which is in a true state while the cell 7, whose electrical state is that of the reference cell 9, is in a false state.

Hence, with these deductions, it is easy to declare that the cell 8 has not changed, that the cell 7 has changed, and that it is the cell 7, the one that has changed and has returned to the state of the reference cell, that is in a false state.

For FIG. 5, with negative reading, the reference cell continues to store electrons (with the presence of − in the capacitor) but its logic state is 0 instead of being 1 as in FIG. 4.

In both cases of positive or negative reading, the true logic state at the time of the verification is the state opposite the logic state of the reference cell.

At the time of the reading, as seen in FIG. 6, if the information (in positive logic as in FIG. 4) is 0 and 0 in the cells 7 and 8, then the true information will be 0, whatever the value of the reference cell since these 0 and 0 values both correspond to insensitive states. This is also the case if these states are 1 and 1 since, both being sensitive, if no cell has changed, it means that the true information is the initial information in both cells.

The third row of the table of FIG. 6 corresponds to FIG. 4 (except that it is shown therein that it is the cell of the right-hand half plane that has changed and not that of the left-hand half plane). Indeed, when the reference is read at 1, it means that is the cell read at 1 that is false and therefore the one read at 0 that is true. The fourth row of the table corresponds to FIG. 5. Indeed, when the reference is read at 0, it is a cell read at 0 that is false and therefore the one read at 1 that is true. The rows 5 and 6 of the table of FIG. 6 show a case where the other cell of the pair has been affected by attack.

The architecture of a real memory relies on the division of the memory cells into different identical structures. Each structure of the memory plane contains a certain number of memory locations each designated by unique coordinates referring to row number and column number.

Since these two parameters are interchangeable, everything that is designated by the term "row" can be replaced by "column" and vice versa. Similarly, the concepts of the invention are similar for identical periodic structures and complimentary periodic structures. Thus, here below in the text, both examples can be applied.

The division into identical elements ensures that a cell designated by a same coordinate in each of the elements possesses the same pattern of insensitivity.

During the reading, the error detection mechanism relies on the simple comparison of the values D and D' read on the structures of FIGS. 7 and 8 which are identical when there are no errors. Should there be an error detection, the correction mechanism is implemented. This correction mechanism then relies on knowledge of the immunity pattern: Ref, which gives information on the one and only sense in which a bit reversal is possible and thus enables the initial value of the piece of data to be retrieved.

The periodic structure can then be an address, a set of addresses, a row (or a column) a set of rows (or columns) a bank, or a set of banks.

The question may arise of knowing how many references are needed. For example, FIG. 7 proposes that there be as many reference cells as there are duplicate cells. This figure illustrates an example of a single-package configuration in which the subdivision is a bank. The term "bank" designates a matrix of rows and columns. With each location having the same immunity pattern within each bank, pieces of data D and D' are duplicated with similar coordinates (Cx, Ly) respectively in the bank 0 and the bank 1. The bank 2 for its part is reserved for the storage of the insensitivity pattern.

Thus, the data bank 0 encloses the cells such as 7, the bank 1 encloses cells such as 8, and the bank 2 encloses reference cells such as 9. FIG. 7, with a three-tiered memory plane in a same component, can easily be divided into three identical juxtaposed components. Indeed, the size of the impact of cosmic, ionic or photonic radiation is small enough for it to be assumed that it reaches certain cells and not other cells in a same memory plane, especially in memory cells made with different juxtaposed or stacked components.

The above descriptions have illustrated the principal of the invention with a worst case rate R, equivalent to the triplication technique explained here above. Thus, to protected N bits, it is necessary to store 3×N bits, the rate is then R=⅓.

For real applications, optimized architectures are used to obtain rates close to R=½. To this end, it is necessary to reduce the quantity of space allocated to the storage of the reference pattern.

Since the memory plane architectures are not communicated by manufacturers, it may be difficult to implement the invention when it is known that, from one memory plane to another, the read mode may change. The optimization therefore consists in having a reference cell for each periodic structure. The rate is then defined by a number of periodic structures. The fewer different structures there are, the closer the rate is to ½.

In the following example, shown in FIG. 8, it is postulated that each row corresponds to a periodic structure. Thus, all the cells have the same insensitivity pattern within a same row. According to this postulate, it is thus possible to use a single column for each row as an insensitivity reference pattern.

In certain components, the read mode changes alternately from one row to another. In this case, it is important to place a reference cell at the beginning, at the end or at the middle or somewhere in each row (FIG. 8) so as to have a reference that will make it possible to designate those cells that are in a true state. In this case, even without knowing the read mode, it is known that, in the event of contradiction, the cell which is in the same logic state as the reference cell is in a false state.

The examples of architectures presented here above address single-package memory configurations, using only one component in integrated circuit form.

An identical form of reasoning can be applied especially for personal type microcomputers with a multi-package architecture in which a certain number of identical components are used in parallel. In this case, one of the components may be specifically used as a reference for the insensitivity patterns, while the others are used to duplicate data.

Figure 9:
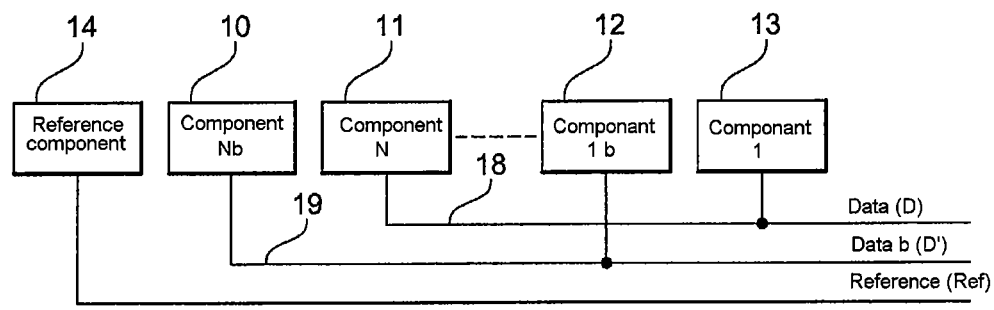
FIG. 9 shows a principle of a multi-package architecture tolerant to faults.

This multi-package configuration is the one used in FIG. 9 by way of an example where a certain number of packages 10, 13 are laid out in parallel. The identical periodic structure is therefore the component itself connected to a data bus. Indeed, the insensitivity pattern is different for each reference and each new revision of circuits but on the contrary it is identical for a same batch of components.

The proposed architecture is based on the use of several components of the same batch which, for a same logic address, would have the same insensitivity state. The architecture uses a component 14 dedicated to the storage of the reference pattern while the other units store the duplicated data. For each bit of the data bus here above, one signal comes from a main component, a second comes from a component B, and a third comes from the reference component.

Figure 10:
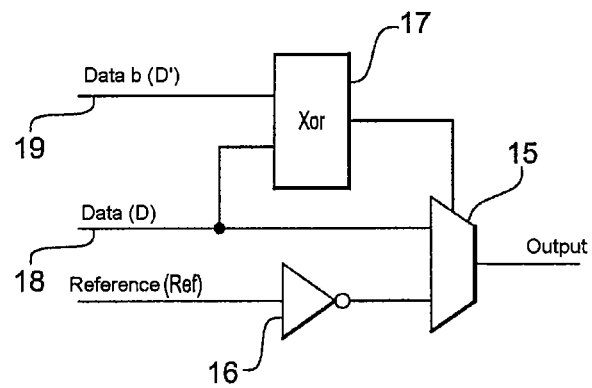
FIG. 10 is a schematic representation of the error-detection and error-correction logic.

FIG. 10 shows a schematic example of an electronic logic circuit to be made for a data row. This circuit is used to instantaneously detect and correct the error without interrupting a continuous flow of information. This logic circuit has to be placed on the rows of the data bus presented in FIG. 9. It consists of a multiplexer 15, an inverter 16, and an exclusive/or gate 17. The gate 17 receives both pieces of data D and D' and takes measurements to see if they are identical. If they are identical, the gate 17 activates the multiplexer 15 so it transmits the state of the data D. If not, according to what we have seen here above, the multiplexer 15 transmits the inverse of the reference state since it has been seen that the reference indicated the cell which had been disturbed and that it was therefore the other cell that was the true one, and that it is therefore the inverse of the reference cell that is true, which is why there is the inverter 16.

Thus, the bit rows 18 and 19 of this type of memory are connected to this detector 15-17 which both detects the error and corrects it. The bit rows 18 and 19 are herein shown as being differentiated. It would be possible however to have a single bit row common to both memory zones, the base zone and the duplicated zone, and to read them in turn by means of a multiplexer. A same row would thus be equivalent to two rows.

Naturally, after an error is detected, it is corrected. In practice, the false data is rewritten with the inverse of the value read in the reference cell.

The invention claimed is:

1. Memory comprising:
   memory cells, which are single or multiple cells, with dissymmetrical behavior wherein the dissymmetrical behavior is exhibited as a sensitivity of the memory cell in a first electrical state by which the memory cell changes from one of a first or a second electrical state to a corresponding one of a second or a first electrical state during an attack by irradiation, the sensitivity being lower for passing from the first state into the second state than for passing from the second state to the first state,
   pairs of memory cells formed by the memory cells with dissymmetrical behavior,
   wherein a first cell of a pair is charged with a first piece of binary information and a second cell of the pair is charged with a second piece of binary information,
   a detector to detect that the first and second memory cells of a pair are charged with two pieces of contradictory information instead of two pieces of consistent information,
   a reference memory cell associated with the pair of memory cells, the reference memory cell being loaded with a piece of information corresponding to the first state, and
   a logic circuit to designate, as a function of the reference memory cell, that the cell of the memory cells of a pair that is in the second state has been affected by the irradiation when the states of the cells of the pair of cells are contradictory.

2. Memory according to claim 1, wherein
   the second piece of information corresponds to a same electrical state as that of the first piece of information so that these pieces of information are consistent,
   contradictory pieces of information being then pieces of information corresponding to complementary electrical states.

3. Memory according claim 1, wherein
   the second piece of information corresponds to an electrical state complementary to that of the first piece of information so that these pieces of information are consistent,
   contradictory pieces of information being then pieces of information corresponding to same electrical states.

4. Memory according to claim 1, wherein
   the detector detects that one of the cells of the pair which has changed its state owing to the irradiation, and the memory further includes
   a logic circuit that designates the other cell as being the cell in a true state.

5. Memory according claim 1, wherein
   the pair reference memory cell is in the first state.

6. Memory according to claim 1, wherein the pair of memory cells are of the DRAM or EPROM type.

7. Memory according to claim 1, further comprising:
   first and second bit rows connected to duplicated memory cells,
   an exclusive- or gate connected to the first and second bit rows
   a duplexer controlled by this exclusive- or gate,
   the duplexer receiving, as inputs, one of the first and second bit rows and a bit row coming from the reference cell.

8. A personal computer including the memory according to claim 1.

9. Method for detecting and correcting data errors stored in a memory, the memory cell of which has dissymmetrical behavior, comprising:
   storing respective pieces of data to be corrected in two data banks,
   detecting an error in one bank and
   correcting the error with the content of the other bank, wherein
   the memory cells in the two data banks exhibit a dissymmetrical behavior resulting from a sensitivity of one of the memory cells switching from one of first or second electrical state to a second or first electrical state, respectively, during an attack by irradiation, the sensitivity being lower for switching from the first state to the second state than for switching from the second state to the first state, the method further including:
   arranging the memory cells in pairs,
   loading a first cell of a pair with a first piece of binary information and a second cell of the pair with a second piece of binary information,
   storing a piece of information corresponding to the first state in a reference memory cell associated with the pair of memory cells,
   detecting that the memory cells of a pair are loaded with two pieces of contradictory information instead of two pieces of consistent information, and
   designating, using a logic circuit, as a function of the pair and the reference memory cell, that one cell of the memory cells of the pair is in a true state.

10. Method according to claim 9 further including correcting the error after the error is detected.

* * * * *